(12) United States Patent
Muranaka et al.

(10) Patent No.: US 12,119,607 B2
(45) Date of Patent: Oct. 15, 2024

(54) TUNABLE LASER

(71) Applicant: Nippon Telegraph and Telephone Corporation, Tokyo (JP)

(72) Inventors: Yusuke Muranaka, Musashino (JP); Shinji Matsuo, Musashino (JP); Nobuhiro Nunoya, Musashino (JP); Toshikazu Hashimoto, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 665 days.

(21) Appl. No.: 17/418,597

(22) PCT Filed: Dec. 26, 2019

(86) PCT No.: PCT/JP2019/051061
§ 371 (c)(1),
(2) Date: Jun. 25, 2021

(87) PCT Pub. No.: WO2020/145173
PCT Pub. Date: Jul. 16, 2020

(65) Prior Publication Data
US 2022/0077645 A1 Mar. 10, 2022

(30) Foreign Application Priority Data
Jan. 7, 2019 (JP) .................. 2019-000813

(51) Int. Cl.
*H01S 3/083* (2006.01)
*H01S 3/063* (2006.01)
*H01S 3/137* (2006.01)

(52) U.S. Cl.
CPC ............. *H01S 3/137* (2013.01); *H01S 3/063* (2013.01); *H01S 3/083* (2013.01)

(58) Field of Classification Search
CPC .... H01S 5/142; H01S 5/1071; H01S 3/06791; G02B 6/293
See application file for complete search history.

(56) References Cited

FOREIGN PATENT DOCUMENTS

JP 2011142191 * 7/2011 ............... H01S 5/14
JP 2013-93627 A 5/2013

* cited by examiner

*Primary Examiner* — Xinning (Tom) Niu
*Assistant Examiner* — Delma R Forde
(74) *Attorney, Agent, or Firm* — Workman Nydegger

(57) ABSTRACT

A wavelength tunable laser includes a filter region having a wavelength selection function on light from a gain region, wherein the filter region is a Sagnac interferometer and includes two ring resonators. The ring resonator has two optical couplers, and first and second curved waveguides connecting the two optical couplers, each of the two optical couplers is configured to receive input of the light from the gain region through an input-output port, to couple light of a resonant peak to a bar port of the input-output port, and to couple light except light at a resonant peak wavelength to a cross port of the input-output port, and the first curved waveguide connects the bar ports of the input-output ports of the two optical couplers, and the second curved waveguide connects the cross ports of ports, of two optical couplers, that the first curved waveguide is connected to.

13 Claims, 5 Drawing Sheets

PRIOR ART

TUNABLE LASER

TECHNICAL FIELD

The present invention relates to a wavelength tunable laser, and specifically, relates to a wavelength tunable laser used for wavelength multiplexing high speed communication.

BACKGROUND ART

In order to handle rapidly growing communication traffic, a transmission volume is being enhanced in recent years by a link, which connects nodes, simultaneously transmitting a bundle of signals having a plurality of different signals superimposed with different wavelengths. In order to realize such transmission of wavelength multiplexed signals, it is essential for a laser to be able to generate beams of light with fine wavelength differences, and a wavelength tunable laser has been conventionally used.

Examples of usable materials for light-emitting elements of wavelength tunable lasers operating in communication wavelength bands include compound semiconductors such as GaAs (gallium arsenide) and InP (indium phosphide). Wavelength tunable lasers using semiconductor materials (semiconductor wavelength tunable lasers) play a crucial role in wavelength multiplexing high speed communication.

FIG. 1 is a configuration diagram of a conventional monolithically integrated wavelength tunable laser 1 including a ring resonator. A gain region and a phase adjustment region include an input-output waveguide 13, and a filter region includes a Sagnac interferometer.

One output port of a 2×2 optical coupler 18 is connected to one input port of a 2×2 optical coupler 17 via a curved waveguide 10a. One output port of the 2×2 optical coupler 17 is connected to one input port of the 2×2 optical coupler 18 via a curved waveguide 10b. Here, two linear waveguides 11 and 12 are arranged near a ring waveguide composed of the two 2×2 optical couplers 17 and 18 and the two curved waveguide 10a and 10b. Namely, the filter region is a Sagnac interferometer having a configuration of a ring resonator. The Sagnac interferometer functions as a loop mirror. The ring resonator functions as an optical filter with which the intensity of transmitted light increases at fixed frequency intervals (Free Spectral Ranges; each hereinafter referred to as FSR).

In this configuration, light from the gain region and the phase adjustment region passes through an input-output waveguide 13 and is equally split by a 1×2 optical coupler 19 constituting an optical splitting and combining unit 16 into beams, and the beams pass through the linear waveguides 11 and 12, respectively, to generate optical coupling at optical coupling units 14 and 15, circulate in the ring waveguide clockwise and counterclockwise, and enter the 1×2 optical coupler 19 again to be externally emitted.

In order to obtain a wavelength tunable range wide enough to cover a generally used communication wavelength band such, for example, as the C-band (wavelength: 1530 to 1570 nm), the FSR needs to be wide, that is, a resonator length (optical path length in the ring resonator) needs to be short. Therefore, high mesa optical waveguides are often used which can make the curvatures of curved waveguides large.

FIG. 2 is a schematic diagram of an exemplary sectional view of a conventionally used high mesa optical waveguide 2. In the high mesa waveguide 2, a substrate 20, a lower cladding 22, a core layer 23 and an upper cladding 24 are stacked in the order from the lower side. A lower electrode 25b is provided on the lower side of the substrate, which is the lowermost layer, and an upper electrode 25a is at the top of the upper cladding 24, which is the uppermost layer. The substrate 20 and the lower cladding 22 are composed of n-InP, the core layer 23 is of InGaAsP, the upper cladding 24 is of p-InP, and the upper electrode 25a is of InGaAsP which is doped with a p-type dopant. The high mesa optical waveguide 2 in FIG. 2 has a structure obtained by etching a semiconductor vertically to the layer of the lower cladding 22. Multimode interference (MMI) couplers are used for the optical splitting and combining unit 16 between the filter region and the gain region, and the optical coupling units 14 and 15 connected to the ring waveguide (curved waveguides 10) constituting the ring resonator.

FIG. 3 is a view having the ring resonator expanded. It can undergo high speed refractive index modulation in nanoseconds by current injection. Furthermore, it can be adjusted accurately to afford a desired oscillation wavelength by providing a phase adjusting optical waveguide (phase adjustment region) in the laser to finely adjust longitudinal mode intervals. The phase adjustment is also performed by current injection.

CITATION LIST

Patent Literature

Patent Literature 1: Japanese Patent Laid-Open No. 2013-093627

SUMMARY OF THE INVENTION

Technical Problem

Finesse is one of indices indicating performance of a ring resonator-type wavelength tunable laser. The finesse represents sharpness of resonance at a resonant frequency, and the more the number of circulations inside the ring resonator is, the more the finesse is improved. Since in FIG. 1, 50% MMI optical couplers are used as the 2×2 optical couplers 17 and 18 constituting the optical coupling units 14 and 15, 50% of light is to be emitted to the outside of the ring every time when the light passes through each MMI coupler. While as disclosed in Patent Literature 1, light that is not coupled to the ring resonator and is output to an output 2 is enhanced by changing the splitting ratio of the MMI couplers to reduce the rate of light emission to the outside of the ring, the finesse can be improved by increasing the number of circulations of the light coupled to the ring resonator. Since in this case, the coupling length of the MMI couplers accordingly results in becoming longer in general, the radii of the bent waveguides 10 forming the ring resonator are requested to be smaller. Although high mesa optical waveguides can realize such relatively small bending radii, the waveguides small in bending radius are not preferable due to their large propagation losses. Some structure is being requested which can expand the FSR while securing the bending radii of the waveguides in the ring resonator to be large.

In contrast to the case of using typical MMI couplers with 50% coupling efficiency in FIG. 3, in the case of reducing the coupling efficiency to the bar ports, the coupling length of the MMI couplers can be thereby reduced, but because of an increasing ratio of light that is emitted to the outside of the ring, the finesse degrades. Even in this case, by configuring a ring resonator such that the bar ports out of the output ports of the MMI couplers are connected together, the finesse can be improved. However, since the waveguides that are connected to radiation waveguides for discarding light except light at a resonant peak wavelength are inner ports of the MMI couplers, the light except the light at the resonant peak wavelength is to remain inside the ring resonator. There are no ways to release the light except the light at the resonant peak wavelength from the radiation waveguides to the outside of the ring, and the light except the light at the resonant peak wavelength is to couple to the ring resonator and degrades filter characteristics.

The present invention is devised in consideration of the aforementioned problem, and an object thereof is to realize excellent filter characteristics for a wavelength tunable laser capable of improving finesse.

Means for Solving the Problem

In order to achieve the object as above, a first aspect of the present invention is a wavelength tunable laser including a filter region having a wavelength selection function on light from a gain region. In a wavelength tunable laser according to an embodiment, the filter region is a Sagnac interferometer that functions as a loop mirror, and includes two ring resonators, the ring resonator has two optical couplers, and first and second curved waveguides connecting the two optical couplers, each of the two optical couplers is configured to receive input of the light from the gain region through an input-output port, to split the light into light of a resonant peak and light except light at a resonant peak wavelength, to couple the light of the resonant peak to a bar port of the input-output port, and to couple the light except the light at the resonant peak wavelength to a cross port of the input-output port, and the first curved waveguide connects the bar ports of the input-output ports of the two optical couplers, and the second curved waveguide connects the cross ports of ports, of the two optical couplers, that the first curved waveguide is connected to.

Effects of the Invention

As described above, according to the present invention, excellent filter characteristics can be realized for a wavelength tunable laser capable of improving finesse.

DESCRIPTION OF EMBODIMENTS

Figure 1:
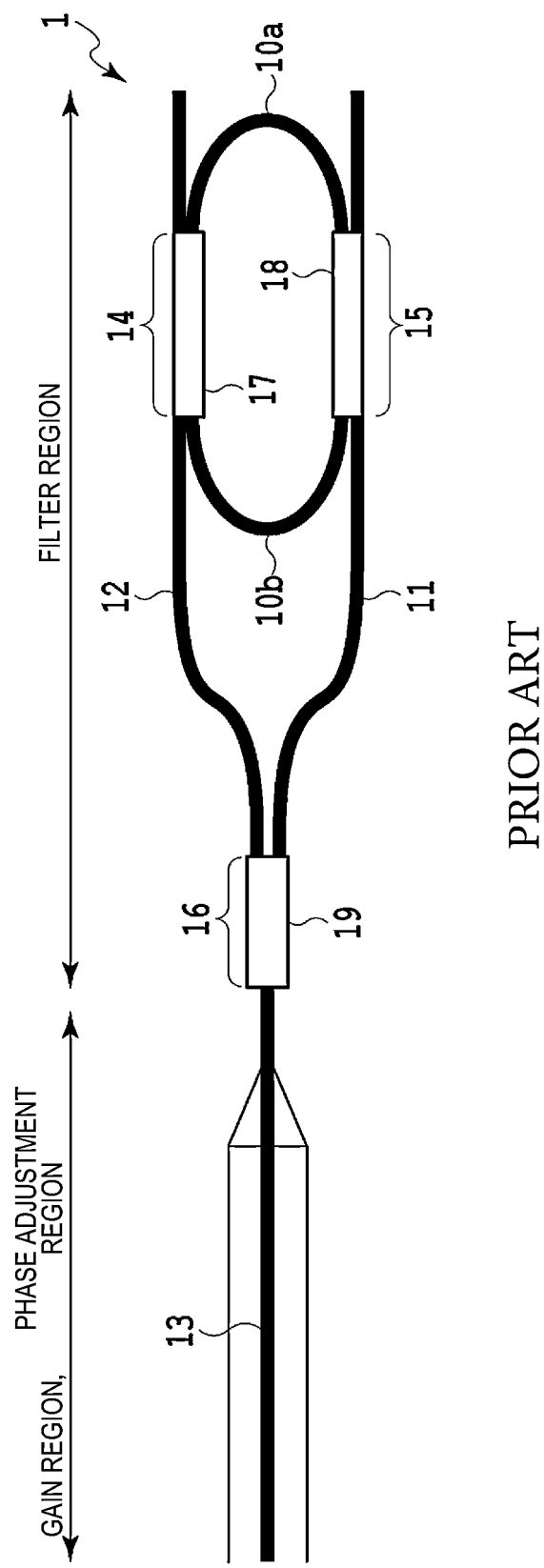
FIG. 1 is a diagram for explaining a conventional wavelength tunable laser.

Embodiments of the invention as claimed in the present application will be hereafter described with reference to the drawings. It is supposed that the same or similar reference numerals denote the same or similar elements, and their duplicated description is omitted.

Figure 2:
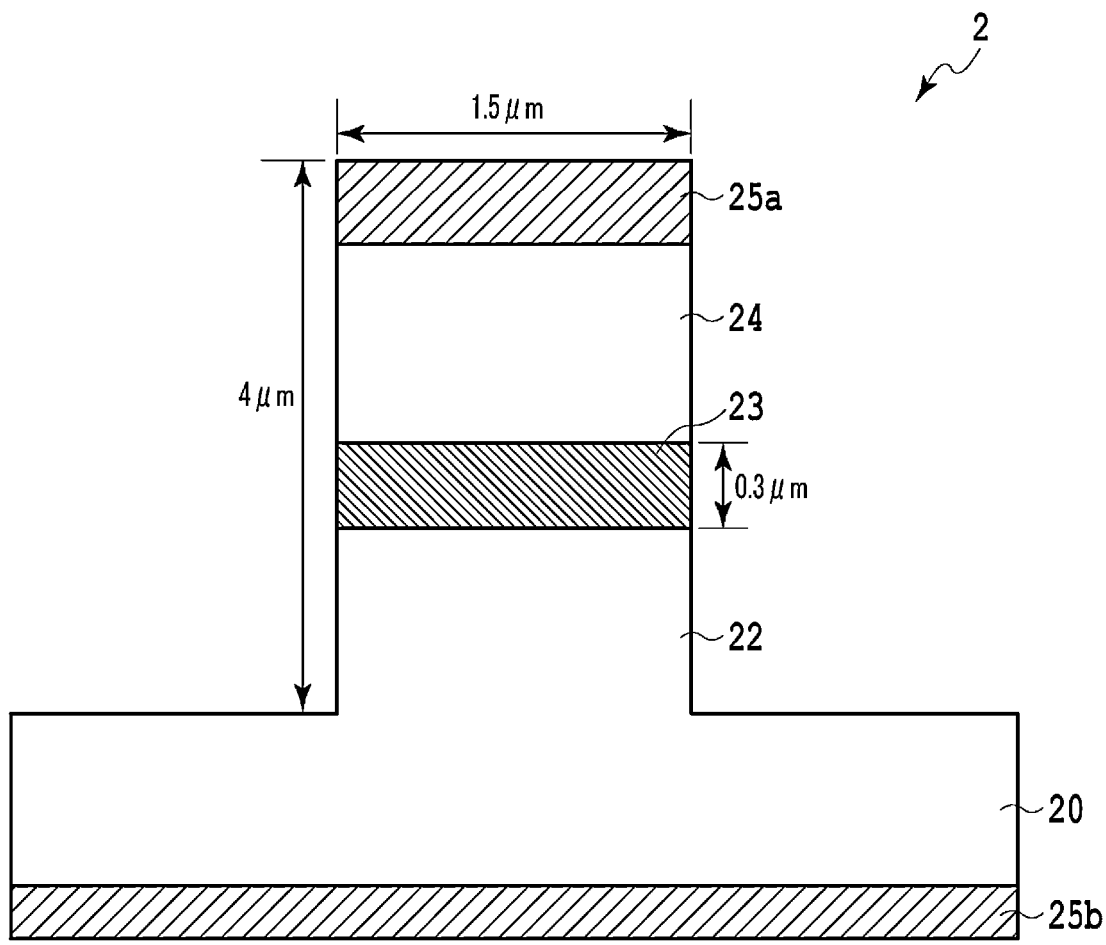
FIG. 2 is a schematic diagram of a sectional view of a high mesa optical waveguide.
Figure 3:
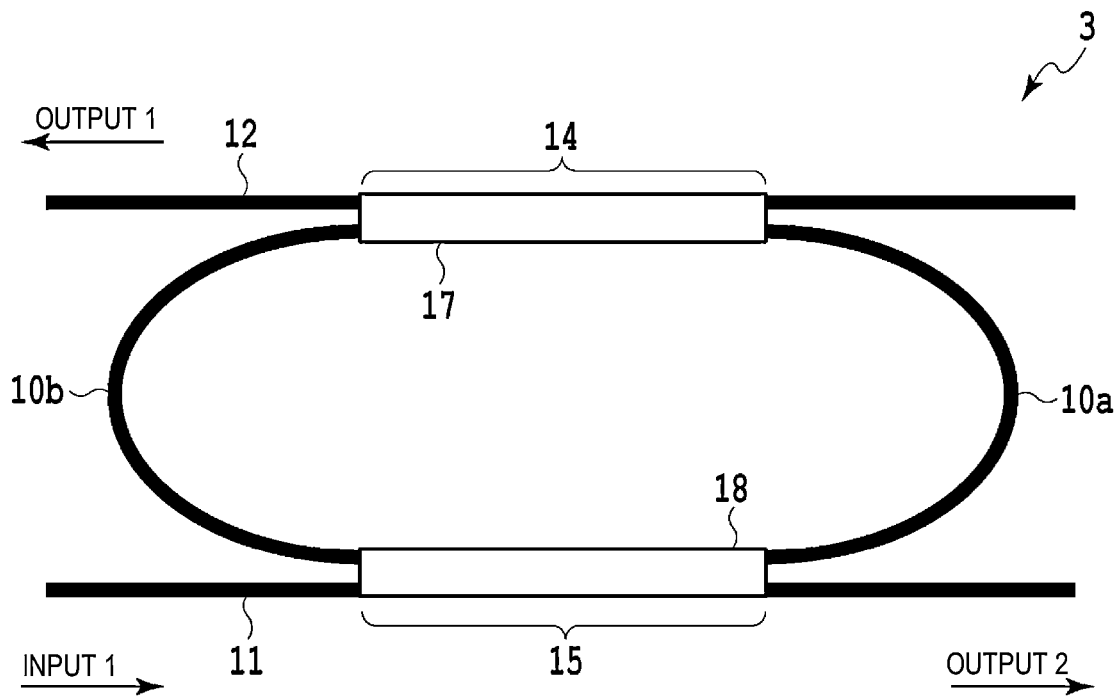
FIG. 3 is an expanded view of the portion of a ring resonator having MMI couplers with 50:50 of coupling efficiency.

As having been described with reference to FIG. 2 and FIG. 3, in the present embodiment, high mesa optical waveguides, which can realize steep bending radii, are used for a ring waveguide connecting 2×2 optical couplers constituting a ring resonator together. Moreover, MMI optical couplers, which can be easily produced and are low in loss, are used for the 2×2 optical couplers. Although in order to reduce a resonator length L, the lengths of optical coupling units (optical coupling lengths) need to be reduced, known directional couplers constituted of high mesa optical waveguides have some problem in terms of their production. High mesa optical waveguides are small in leakage of light in the traverse direction due to a large specific refractive index relative to the air. While when directional couplers constituted of such high mesa optical waveguides are used for the optical coupling units, the distance between the two high mesa optical waveguides accordingly needs to be 0.1 micrometers or less in order to reduce the optical coupling lengths, a deep trench (its depth is typically three to four micrometers) having about 0.1 micrometers of width is very difficult to form by means of etching or the like in terms of its processing.

While MMI optical couplers have an advantage as described above, they have a disadvantage that each of them can obtain only a fixed optical coupling efficiency. In the case of 2×2 MMI optical couplers used for a ring resonator, a length $L_{MMI}$, of an MMI optical coupler, which defines an optical coupling efficiency of light entering an input port to a cross port is expressed by expression (1) below.

Math. 1

$$L_{MMI} = M\frac{n_{eq}(2W_{wg} + W_{gap})^2}{\lambda} \quad \text{(Expression 1)}$$

Herein, $n_{eq}$ is an equivalent refractive index, $W_{wg}$ is the width of an input-output waveguide, $W_{gap}$ is a distance between input-output waveguides, and $\lambda$ is a wavelength used. In the case of a 50% MMI coupler, by setting M in the expression to 2, an input optical field is equally split, and it operates as a coupler with 50% of coupling efficiency. The ring resonator has a feature that at an optical coupling unit thereof, a smaller optical coupling efficiency to the cross port leads to more improvement of the finesse. Namely, this leads to more circulations of the light in the ring resonator, sharper resonance thereof, and more improvement of wavelength selection performance. Therefore, by changing a splitting ratio from 50%, it is adjusted such that more light circulates in the ring.

Figure 4:
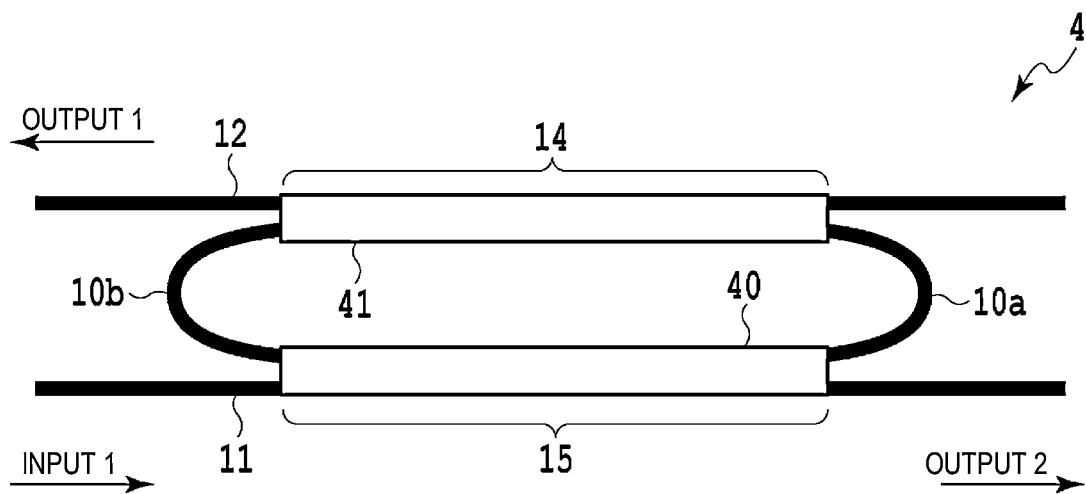
FIG. 4 is an expanded view of the portion of a ring resonator having MMI couplers with 85:15 of coupling efficiency.

FIG. 4 shows an expanded view of the portion of the ring resonator in the case where MMI optical couplers with 85% of coupling efficiency are used. By setting M in expression (1) to 3, 85% of light input to the MMI coupler can be coupled to the bar port. In this case, the length of each MMI optical coupler however is three halves of that of the 50% MMI coupler, and the ratio of the length of the MMI optical couplers relative to the resonator length (length of the waveguides constituting the ring resonator) is high. Accordingly, the optical waveguides connecting the MMI couplers need to be short, and small bending radii are required for the curved waveguides. Since the aforementioned influence is especially large on a ring resonator with a wide FSR, FSRs that can be provided are limited.

Therefore, the present embodiment employs a structure using MMI optical couplers with 15% of coupling efficiency, and in the structure, the bar ports are connected together unlike a structure which is generally used for a conventional ring resonator and in which the cross ports of MMI optical couplers are connected together.

Figure 5:
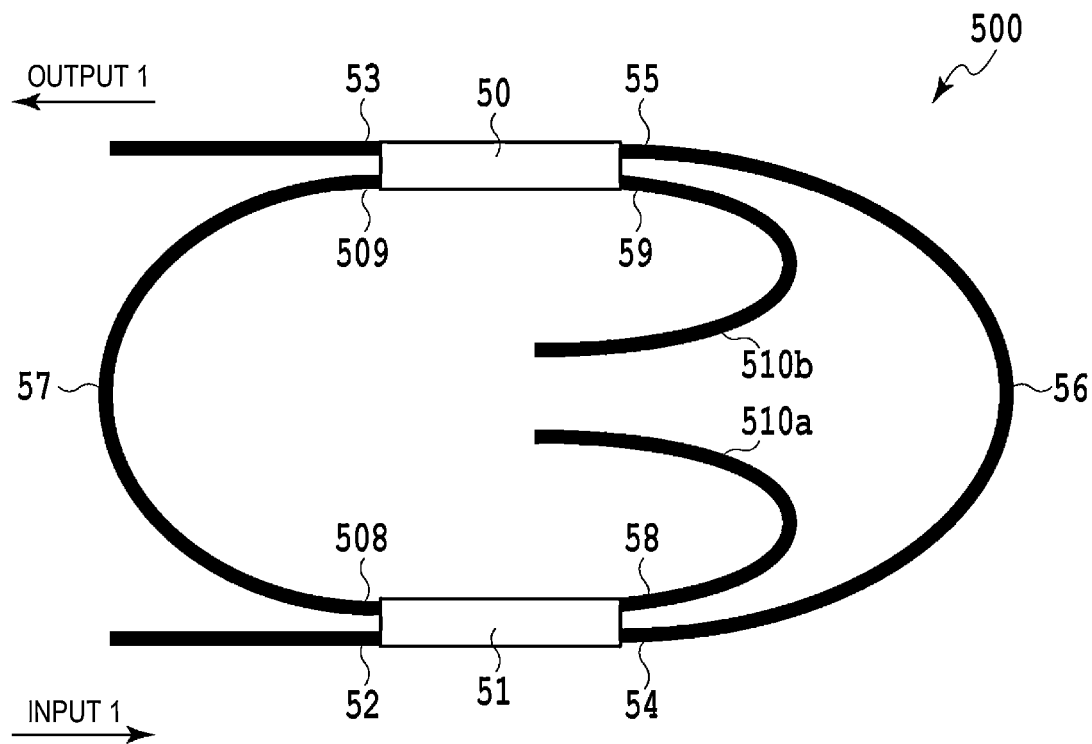
FIG. 5 is an expanded view of the portion of a ring resonator of a wavelength tunable laser according to an embodiment of the present invention.

FIG. 5 shows a configuration of a ring resonator 500 of the present embodiment in which MMI optical couplers with 15% of coupling efficiency are used. The ring resonator 500 includes two MMI optical couplers 50 and 51 each having two inputs and two outputs, and curved waveguides 56 and 57 connecting the two MMI optical couplers 50 and 51. Moreover, the ring resonator 500 further includes a linear waveguide for optical input and a light discarding waveguide 510a which are connected to the MMI optical coupler 51, and a linear waveguide for optical output and a light discarding waveguide 510b which are connected to the MMI optical coupler 50.

The linear waveguide for optical input is connected to a first input-output port 52 of the MMI optical coupler 51. The curved waveguide 56 is connected to a bar port 54 with respect to the first input-output port 52 of the MMI optical coupler 51, and a bar port 55 with respect to a first input-output port 53 of the MMI optical coupler 50. The linear waveguide for optical output is connected to a bar port 53 with respect to the first input-output port 55 of the MMI optical coupler 50. The curved waveguide 57 is connected to a cross port 509 with respect to the first input-output port 55 of the MMI optical coupler 50, and a second input-output port 508 of the MMI optical coupler 51. The light discarding waveguide 510a is connected to a cross port 58 with respect to the first input-output port 52 of the MMI optical coupler 51 (bar port with respect to the second input-output port 508). The light discarding waveguide 510b is connected to a second input-output port 59 of the MMI optical coupler 50.

For the MMI optical couplers 50 and 51, by setting M in expression (1) to 1, 15% of light input to the MMI coupler is coupled to the bar port. When 15% of the light is coupled to the bar port of the MMI optical coupler, 85% of the light is connected to the cross port, hence, the cross ports of the MMI optical couplers are connected together with the waveguides to form a ring resonator, and the waveguide of the cross port from an input 1 is set to be a discarding waveguide inside the ring resonator.

Since in this case, the discarding waveguide emits light inside the ring, the light couples again to the waveguides constituting the ring to affect resonant light, and hence, can cause degradation in characteristics of the laser. There are therefore presented below some embodiments of a structure which does not allow the light from the discarding waveguides to couple to the ring resonator.

Embodiment 1

Figure 6:
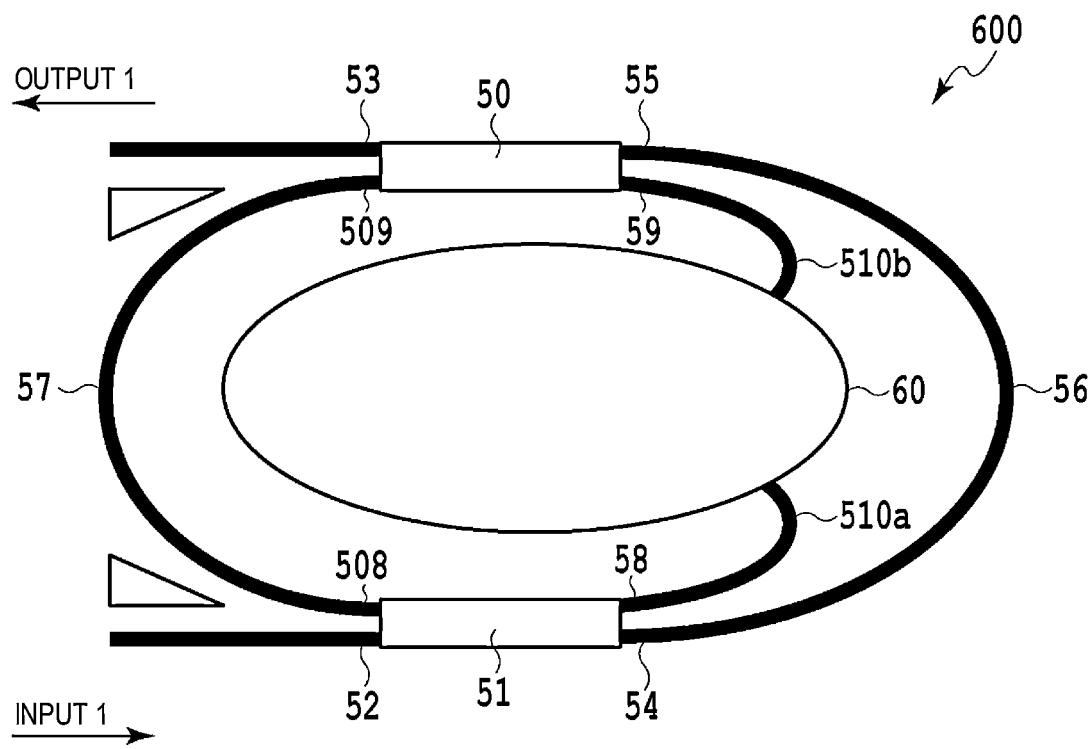
FIG. 6 is an expanded view of the portion of a ring resonator according to Embodiment 1.

FIG. 6 is a configuration diagram of a ring resonator 600 according to Embodiment 1. The waveguide for the input 1 is input to the 15:85 MMI optical coupler 51, 15% of light is coupled to a ring waveguide of the ring resonator 600 (curved waveguide 56), and 85% of the light is coupled to a discarding waveguide inside the ring resonator (light discarding waveguide 510a). The discarding waveguides are bent at bending radii smaller than that of the curved waveguide 56 of the ring resonator, and connected to a slab region 60 at the center of the ring. The slab region 60 has an elliptical shape, light entering a slab waveguide is reflected at the boundary of the slab region 60, and all the beams of the light reflected at any angles concentrate at the focal points of the ellipse. Since the structure in FIG. 6 allows light input to the discarding waveguides to be evenly scattered and absorbed, light returning to the inside of the ring resonator can be reduced.

Figure 7:
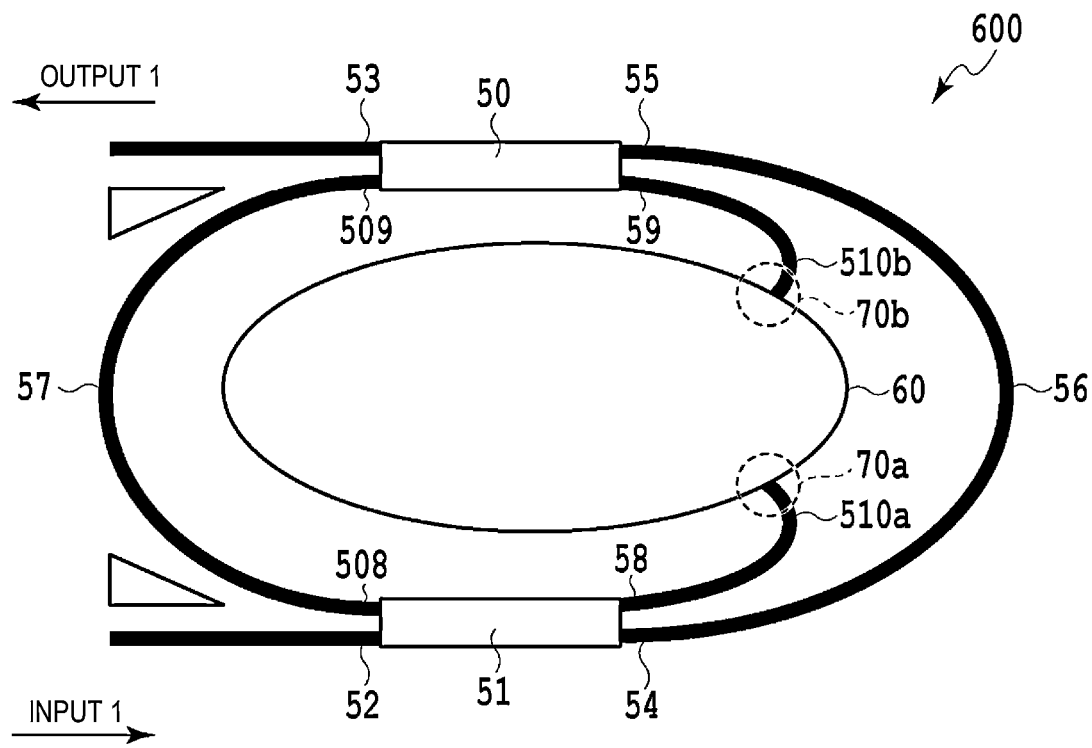
FIG. 7 is an expanded view of the portion of a ring resonator according to a modification of Embodiment 1.

Furthermore, by more reducing the bending radii of connection units of the discarding waveguides (light discarding waveguides 510a and 510b) to the slab region 60 as shown in FIG. 7 to adjust input angles to the slab region 60 at the centers of the connection rings to be acute relative to the slab region 60, for example, by connecting the light discarding waveguides 510a and 510b to the slab waveguide 60 at acute angles, the influence of reflection in slab waveguide coupling can be reduced.

Embodiment 2

Figure 8:
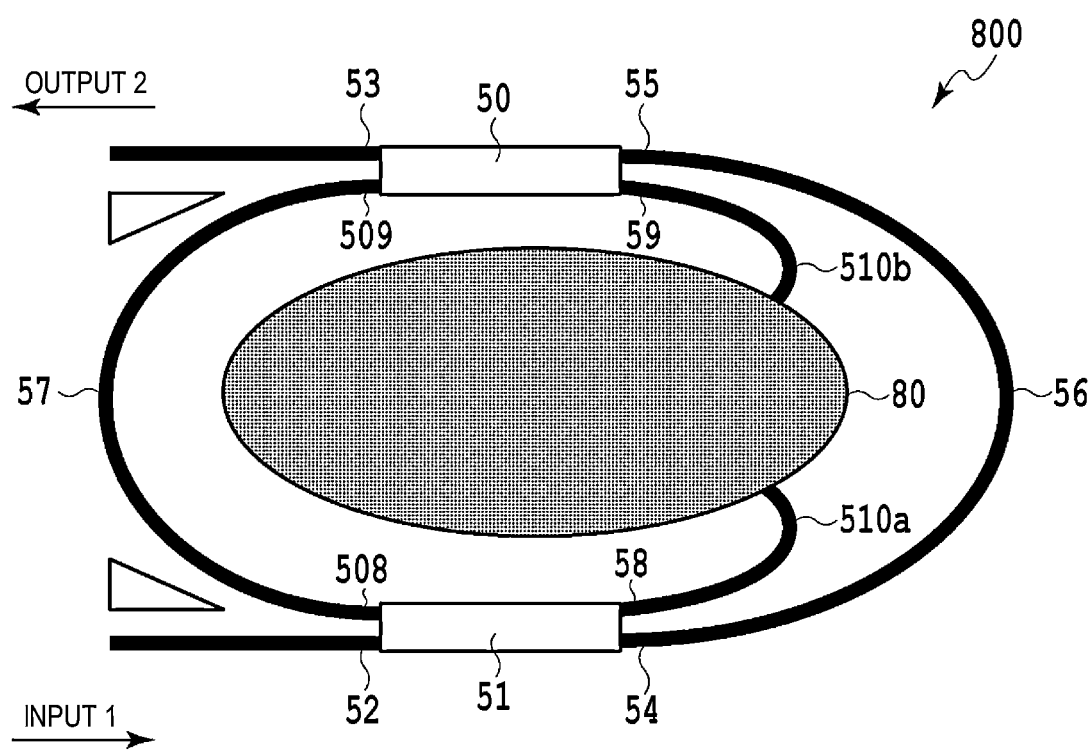
FIG. 8 is an expanded view of the portion of a ring resonator according to Embodiment 2.

FIG. 8 is a structural diagram of a ring resonator 800 according to Embodiment 2. Similar to Embodiment 1, the waveguide for the input 1 is input to the 15:85 MMI optical coupler 51, 15% of light is coupled to a ring waveguide of the ring resonator 800 (curved waveguide 56), and 85% of the light is coupled to a discarding waveguide inside the ring resonator (light discarding waveguide 510a). The discarding waveguides are bent at bending radii smaller than that of the curved waveguide 56 of the ring resonator, and connected to an absorption region 80 at the center of the ring. For the absorption region 80 at the center of the ring, the active layer used for the gain region of the wavelength tunable laser is caused to remain to have an elliptical shape, and a light absorption function of the active layer is used. Since in addition to the elliptical structure in Embodiment 1, unnecessary light can be absorbed, optical coupling to the inside of the ring resonator due to scattering can be reduced.

REFERENCE SIGNS LIST

1 Monolithically integrated wavelength tunable laser
10a, 10b Curved waveguide
11, 12 Linear waveguide
13 Input-output waveguide
14, 15 Optical coupling unit
16 Optical splitting and combining unit
17, 18 2×2 optical coupler
19 1×2 optical coupler
2 High mesa optical waveguide
20 Substrate
22 Lower cladding
23 Core layer
24 Upper cladding
25a Upper electrode
25b Lower electrode
3, 4 Ring resonator
40, 41 2×2 optical coupler
50, 51 MMI optical coupler with 15:85 of splitting ratio
500 Ring resonator
52, 55 First input-output port
53, 54 Bar port
56, 57 Curved waveguide
58, 509 Cross port
59, 508 Second input-output port
510a, 510b Light discarding waveguide
60 Slab region
600 Ring resonator
70a, 70b Connection unit
80 Absorption region
800 Ring resonator

The invention claimed is:

1. A wavelength tunable laser comprising a filter region having a wavelength selection function on light from a gain region, wherein
the filter region is a Sagnac interferometer that functions as a loop mirror, and includes two ring resonators,
the ring resonator has two optical couplers, and first and second curved waveguides connecting the two optical couplers,
each of the two optical couplers is configured to receive input of the light from the gain region through an input-output port, to split the light into light of a resonant peak and light except light at a resonant peak wavelength, to couple the light of the resonant peak to a bar port of the input-output port, and to couple the light except the light at the resonant peak wavelength to a cross port of the input-output port,
the first curved waveguide connects the bar ports of the input-output ports of the two optical couplers, and the second curved waveguide connects the cross ports of ports, of the two optical couplers, that the first curved waveguide is connected to;
inside a loop of the ring resonator, two radiation waveguides are connected to the cross ports of the input-output ports of the two optical couplers and discard the light except the light at the resonant peak wavelength, and,
the radiation waveguide are connected to an elliptical slab waveguide inside the loop of the ring resonator.

2. The wavelength tunable laser according to claim 1, wherein each of the two optical couplers is configured such that a ratio of the light, except the light at the resonant peak wavelength, that is coupled to the radiation waveguide is higher than a ratio of the light, of the resonant peak, that is coupled to the first curved waveguide.

3. The wavelength tunable laser according to claim 2, wherein the radiation waveguides are connected, inside the loop of the ring resonator, to a waveguide having an active layer identical to an active layer of the gain region for the laser.

4. The wavelength tunable laser according to claim 2, wherein the optical coupler is a multimode interference coupler.

5. The wavelength tunable laser according to claim 2, wherein the optical coupler is a directional coupler.

6. The wavelength tunable laser according to claim 4, wherein the radiation waveguides are connected to the elliptical slab waveguide at an acute angle.

7. The wavelength tunable laser according to claim 6, wherein the optical coupler is a multimode interference coupler.

8. The wavelength tunable laser according to claim 6, wherein the optical coupler is a directional coupler.

9. The wavelength tunable laser according to claim 1, wherein the optical coupler is a multimode interference coupler.

10. The wavelength tunable laser according to claim 1, wherein the optical coupler is a directional coupler.

11. A wavelength tunable laser comprising filter region having wavelength selection function on light from a gain region, wherein
the filter region is a Sagnac interferometer that functions as a loop mirror, and includes two ring resonators,
the ring resonator has two optical couplers, and first and second curved waveguides connecting the two optical couplers,
each of the two optical couplers is configured to receive input of the light from the gain region through an input-output port, to split the light into light of a resonant peak and light except light at a resonant peak wavelength, to couple the light of the resonant peak to a bar port of the input-output port, and to couple the light except the light at the resonant peak wavelength to a cross port of the input-output port,
the first curved waveguide connects or ports of the input-output ports of the two optical couplers, and the second cu connects the cross ports of ports, of the two optical couplers, that the first curve e is connected to,
inside a loop of the ng resonator, two radiation waveguides are connected to the cross ports of put-output ports of two optical couplers and discard the light except the light at the resonant peak wavelengths, and
the radiation waveguides are connected, inside the loop of the ring resonator, to a waveguide having an active layer identical to an active layer of the gain region for the laser.

12. The wavelength tunable laser according to claim 11, wherein the optical coupler is a multimode interference coupler.

13. The wavelength tunable laser according to claim 11, wherein the optical coupler is a directional coupler.

* * * * *